United States Patent [19]

Moore et al.

[11] Patent Number: 4,581,479

[45] Date of Patent: Apr. 8, 1986

[54] DIMENSIONALLY PRECISE ELECTRONIC COMPONENT MOUNT

[76] Inventors: Theodore W. Moore, 10403 N. 38th St., Phoenix, Ariz. 85028; Simon A. Tucker, 5709 Tam-O-Shanter Ct., Sarasota, Fla. 33583

[21] Appl. No.: 672,082

[22] Filed: Nov. 16, 1984

[51] Int. Cl.[4] ........................ H01C 1/144; H01G 1/14
[52] U.S. Cl. .................................... 174/52 R; 29/588; 338/324; 357/68; 361/308
[58] Field of Search ........................ 174/52 R, 52 PE; 361/306-310, 433; 357/68; 338/322, 324, 329; 29/588

[56] References Cited

U.S. PATENT DOCUMENTS

| | | | |
|---|---|---|---|
| 3,150,300 | 9/1964 | Schils et al. | 361/310 |
| 3,828,227 | 8/1974 | Millard et al. | 361/433 |
| 3,855,505 | 12/1974 | Karlik, Jr. et al. | 361/433 |
| 4,097,915 | 6/1978 | Locke | 361/433 |
| 4,158,218 | 6/1979 | McLaurin et al. | 361/308 |
| 4,197,570 | 4/1980 | Kobayashi | 361/310 |
| 4,247,883 | 1/1981 | Thompson et al. | 361/433 |
| 4,349,860 | 9/1982 | Ohsawa | 361/310 |
| 4,417,298 | 11/1983 | Nakata et al. | 361/433 |

*Primary Examiner*—Arthur T. Grimley
*Assistant Examiner*—D. A. Tone
*Attorney, Agent, or Firm*—Robert A. Hirschfeld; James F. Duffy

[57] ABSTRACT

In a dimensionally precise electronic component mount, electrical terminals are affixed with dimensional precision to a rigid insulative base. An electronic component is affixed in precisely indexed abutment to the rigid insulative base. A protruding wire of the electronic component is conductively affixed within a v-shaped notch adjacent a notch apex in a second electrical terminal. Embodiments of the rigid insulated base include a flat rectangular plate and a hollow tube having a rectangular cross-section. Contact surfaces and contact pins coact respectively with hybrid substrates and printed circuit boards. Web means coupling adjacent iterated embodiments supports and provides dimensional precision during assembly. An embodiment having a plurality of electrical terminals permits accommodation of an electronic component having a plurality of protruding wires. Mechanical affixation is accomplished alternatively by soldering, welding or adhesives. Electrical continuity is accomplished alternatively by soldering, welding or conductive adhesives.

37 Claims, 8 Drawing Figures

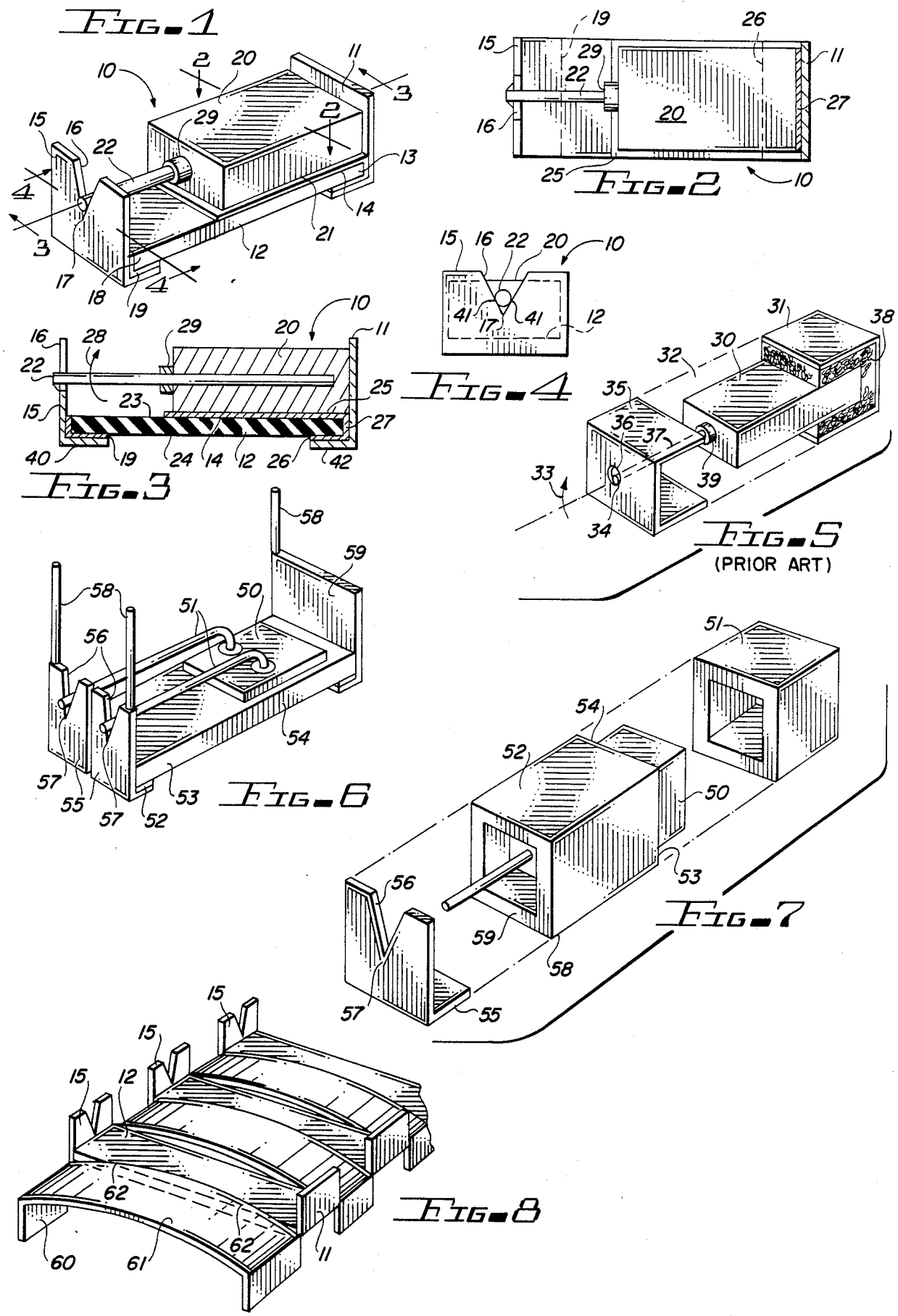

DIMENSIONALLY PRECISE ELECTRONIC COMPONENT MOUNT

BACKGROUND OF THE INVENTION

1. Technical Field

The invention relates to mounts for electronic components.

In particular, the invention relates to a dimensionally precise mount for an electronic component wherein the component has a mounting base defining one electrical node, and at least one protruding wire defining another electrical node, wherein the electronic component is precisely indexed in relation to electrical terminals and an insulative base.

The invention further relates to a dimensionally precise mount for an electronic component wherein bending moment applied to a wire protruding from the electronic component is minimized in assembly and use.

2. Prior Art

The operative elements of electronic components such as tantalum capacitors, semiconductor diodes, transistors, monolithic integrated circuits, resistors, inductors and the like are generally enclosed, as is well known in the art, within physically handlable packages or mounts suitable for physical emplacement upon and electrical connection to hybrid substrates, printed-circuit boards and the like. Such mounts are particularly necessary where microminiature components have easily damaged protruding wires or surfaces easily contaminated in handling.

Many types of such electronic components, exemplified by the tantalum capacitor, comprise a component body, such as the tantalum capacitor cathode, having a solderable or electrically conductive surface definable as a mounting surface, and at least one protruding wire, such as the tantalum capacitor anode riser, which in use extends laterally in a direction essentially parallel to the mounting surface. Semiconductor devices commonly have one electrical node comprising a mounting surface, and from an obverse surface one or more wires protruding laterally or disposed laterally from an initial protrusion orthogonal to the mounting surface.

Prior-art mounts for tantalum capacitors typically comprised a cathode terminal soldered in imprecise spatial relationship to the mounting surface, and an anode terminal or cap having a central hole through which the relatively rigid anode riser wire was passed using hand-assembly methods. The central hole was necessarily larger than the diameter of the anode wire, to permit passage therethrough, and therefore when the anode riser wire was welded to the larger-diameter periphery, the weld occupied only a small portion of the respective peripheries, causing yield losses due to cold welds or burnt welds. Welding problems also arose because the anode riser wire, typically composed of metallic tantalum, had a substantially higher melting point than the metal from which the anode terminal or cap was fabricated, and because of substantial differences in thickness between the anode riser wire and the relatively thin anode terminal.

A polymer typically was injected to fill voids in the tantalum capacitor mount structure, and an outer covering applied. Because the physical dimensions and locus of the tantalum capacitor within the prior-art mount structure was subject to wide manufacturing variations, it was necessary that the overall mount be substantially larger than the size minimally necessary to accomplish its function.

Tantalum capacitors, because of the nature of their fabrication, have an annular region adjacent the juncture of the anode riser wire and the body of the capacitor covered by an easily fractured, brittle insulating layer, typically tantlum pentoxide. Prior art methods of welding and assembling terminals to said anode riser wire frequently imposed destructive bending moment during assembly, or stresses which eventually resulted in shorts due to fracturing of the fragile annular insulating layer.

Similarly, semiconductor devices having protruding wire leads are prone to microscopic fracturing stresses from bending or flexure of said leads during and after assembly. Prior-art mounts or packages for such semiconductor devices resorted to relatively long, flexible wire leads, and wide, conservative space tolerances, with the result that most mounts or packages for semiconductors are substantially larger than needed simply to contain and provide terminal access to the semiconductor device.

It is therefore an object of the invention to provide a component mount and method of assembling same inherently capable of greater mechanical dimension precision than that of the prior art.

It is another object of the invention to provide a dimensionally precise electronic component mount having size and terminal disposition independent of expected variations in production dimensions of the electronic component.

A further object of the invention is to provide a dimensionally precise electronic component mount wherein bending moment or flexure of component wire leads is minimized during and after assembly.

Another object of the invention is to provide a dimensionally precise electronic component mount having reduced susceptibility to cold or burnt welds between component wire leads and electrical terminals.

A still further object of the invention is to provide a dimensionally precise electronic component mount suitable for iterative assembly along a continuous web.

Yet another object of the invention is to provide a dimensionally precise electronic component mount having rigid support for an electronic component mounting surface.

DISCLOSURE OF THE INVENTION

A rigid insulating base, for example of ceramic material, having precise dimensions only slightly larger than a mounting surface of an electronic component, is provided with surface metallizations suitable for precise mechanical indexing and attachment of electrical terminals disposed orthogonally at opposing ends of the insulative base. A first electrical terminal is electrically conductive to a first electrical node of the electronic component through the mounting surface. One or more other electrical nodes of the electronic component are continuous through respective protruding wires. At least one of a plurality of electrical terminals is affixed to respective electrically isolated metallizations opposite the metallization upon the insulative base to which the first electrical terminal is affixed. A v-shaped notch having a notch apex is formed in each one of the plurality of electrical terminals, with the notch apex disposed so that the respective protruding wire rests upon assembly without exertion of bending moment or flexure within the notch apex. The protruding wire is mechanically affixed and made electrically continuous within the notch apex, for example by welding, juncture occurring along both sides of the v-shaped notch.

When assembled as part of a web, portions of the web temporarily support and precisely define distance between the electrical terminals. Other portions of the web guide the insulative base into precise juxtaposition with the electrical terminals during assembly, prior to affixing the electrical terminals at their respective metallizations to the insulative base. The combination of the metallizations and the precisely juxtaposed electrical terminals permits precise indexing of the mounting face of the electronic component against the insulative base. Interlinking portions of the web are removed when assembly is completed.

The precise assembly, by virtue of its indexing, can result in an overall size smaller than that of prior art, which was obliged to provide for relatively large variations in size and disposition of the electronic component and the electrical terminals.

The rigidity of the insulative base strengthens the overall mount and fixes the spatial relationship of those portions of the electrical terminals as are engaged with a hybrid substrate or a printed circuit board. Since said spatial relationship is more precisely defined than with prior art mounts, substrates or printed circuit boards may space various mounted components more closely and thereby achieve greater packing density.

In one embodiment of the invention, the insulative base is a thin, flat, rigid rectangle, with terminals on each end forming a "U-shaped" mount.

In another embodiment of the invention, the insulative base is a hollow rigid tube of rectangular cross-section, to which the respective electrical terminals form end-caps or closures. The electronic component is affixed within the hollow tube, with protruding portions, if any, extending into a concave end-cap.

As used herein, "metallization" means any conductive surface application and includes metallization by vapor deposition plating, tinning and coating, as with conductive epoxy coatings and the like.

In another embodiment of the invention, the electrical terminals are joined to the insulative base by non-conductive adhesive, electrical conductivity separately established between the electronic component and the electrical terminals.

BRIEF DESCRIPTION OF THE DRAWINGS

FIG. 1 is a perspective view of the invention showing a tantalum capacitor indexed upon an insulative base between two electrical terminals.

FIG. 2 is a top view along lines 2—2 of FIG. 1.

FIG. 3 is a sectional view along lines 3—3 of FIG. 1.

FIG. 4 is a view taken along line 4—4 of FIG. 1.

FIG. 5 is a perspective view illustrating a prior-art tantalum capacitor mount.

FIG. 6 is a perspective view of another embodiment of the invention illustrating an electronic component having a plurality of protruding wires in coaction with a plurality of electrical terminals, and further showing disposition of a contact pin upon each electrical terminal.

FIG. 7 is an exploded perspective view of an embodiment of the invention wherein the insulative base is a hollow tube of rectangular cross-section and a portion of the electronic component protrudes into a concave end-cap.

FIG. 8 is a perspective view of a continuous web upon which replicated versions of the invention are assembled.

BEST MODE FOR CARRYING OUT THE INVENTION

For the purposes of promoting an understanding of the principles of the invention, reference will now be made to the embodiments illustrated in the drawings. Specific language will be used to describe the same. It will, nevertheless, be understood that no limitation of the scope of the invention is thereby intended, such alterations and further modifications in the illustrated device; and such further applications of the principles of the invention as illustrated herein being contemplated as would normally occur to one skilled in the art to which the invention relates.

FIG. 1 illustrates, in perspective view, the assembly generally referred to as 10 of an embodiment of the present invention. Electrical terminal means 11 is soldered to rigid insulative base means 12 at surface metallization 14 adjacent end 13 of rigid insulative base means 12. Electrical terminal means 15, having a v-shaped notch 16 defining notch apex 17, is soldered at surface metallization 19 to rigid insulative base means 12 adjacent end 18.

An electronic component, generally referred to as 20, has an operative node electrically continuous to mounting surface 21 of electronic component 20, and a second operative node electrically continuous to protruding wire 22 of electronic component 20. Electronic component 20 is affixed by conductive adhesive, solder or the like to surface metallization 14. As may be more clearly seen in FIG. 3, surface metallization 14 comprises (1) an indexing face portion 25 upon indexing face 23 of rigid insulative base means 12, (2) a contact face portion 26 upon contact face 24 of rigid insulative base means 12, and (3) an end portion 27 upon end 13 of rigid insulative base means 12. Positional disposition of the elements of FIG. 1 is more clearly visible in FIGS. 2 and 3.

What has thus far been disclosed is an embodiment wherein terminals 11,15 are affixed to insulated base 12 by electrically conductive means. However, the advantages of the invention may also be realized in embodiments wherein surface coatings 19, 25-27 refer to a non-conductive adhesive, rather than a metallization. In such a case, conductive affixing means 43, such as solder, conductive adhesive or the like, provides the electrical conduction path between component 20 and terminal 11.

In the exposition of the electronic component mount 10 herein disclosed a tantalum capacitor has been chosen as illustrative of electronic component 20. It is worthy of note at this point in the disclosure, that the exterior of a tantalum capacitor has a finite sheet resistance. If the resistance can be reduced, losses can be reduced and a higher quality capacitor will be derived. Those skilled in the art will recognize the advantages of providing a parallel conduction path between remote portions of the exterior surface of tantalum capacitor, component 20 and terminal 11. This may be accomplished by utilizing a conductive affixing means or metallization as the surface coating referenced 25 in FIG. 3.

Referring to FIGS. 1,2,3 and 4, the apex 17 of v-shaped notch 16 is spaced in relationship to indexing face 23 such that wire 22 lies in v-shaped notch 16 without being stressed by bending moment 28. It may be seen that apex 17 is located at an optimal height for the particular type of electronic component to be mounted.

By way of example, electronic component 20 is shown in FIGS. 1,2,3 and 4 as a typical tantalum capacitor. An easily fractured annular insulating ring 29 circumscribes wire 22 adjacent the juncture of wire 22 and the operative portion of electronic component 20. In prior-art example, FIG. 5, a tantalum capacitor 30, analogous to electronic component 20, is shown, wherein prior-art bending moment 33 was a likely source of damage to annular insulating ring 39, because terminals 31,35 were unsupported prior to molding of encapsulant 32 (shown in phantom, FIG. 5) Further, encapsulant 32 was flexible enough even when cured to permit the creation of destructive bending moment 33 and the concomitant fracturing of insulating ring 39.

Comparing FIG. 4, the emplacement of wire 22 into v-shaped notch 16 permits mechanical affixation and the creation of electrical continuity between wire 22 and electrical terminal means 15 at two loci-of-tangency 41 of v-shaped notch 16 and wire 22. In the prior art shown in FIG. 5, only a single locus-of-tangency 34 was possible between wire 37 and hole 36. Thus, the present invention permits multiple and more secure solder or weld joints between wire 22 and the transverse loci 41 of v-shaped notch 16 than permitted in the prior art between wire 37 and hole 36, thereby improving both mechanical and electrical integrity.

When as in FIG. 5 wire 37 was welded in prior art within hole 36, a welding head or wedge (not shown) pressed downward exterior to terminal 35 adjacent hole 36, which acted as a fulcrum in transmitting bending moment 33 toward ring 39. The present invention's v-shaped notch 16 allows the welding head or wedge (not shown) to be downwardly disposed in a plane defined by notch 16, eliminating any moment arm between the direction of welding force and tangency loci 41. Thus, the fulcrum-centered bending moment 33 of prior art FIG. 5 is absent in the present invention, and welding may be accomplished without bending or flexing wire 22 in relation to terminal 15.

The prior-art assembly of FIG. 5 is typically manually assembled, with wire 37 imprecisely aimed at and passed through hole 36 during assembly. By comparison, the method of assembly of the present invention, more completely described hereinafter, includes the step of placing the electronic component 20 against the indexing surface of a rigid pre-assembly such that there is no likelihood of flexure of wire 22 during assembly. The v-shape of notch 16 also aids in guiding wire 22 toward notch apex 17.

The relatively thick bonding material 38 used in prior art, FIG. 5, did not accurately fix the spatial relationship between tantalum capacitor 30 and electrical terminal means 31, aggravating thereby the dimensional imprecision of the prior art, and increasing the likelihood of introduction during attempted alignment of destructive bending moment 33 and the fracture of insulating ring 39.

FIG. 3 shows that contact surface 40 of electrical terminal means 15 and contact surface 42 of electrical terminal means 11 define a fixed spatial relationship more precise than likely in the prior art assembly of FIG. 5. This results from the fact that the surface of base 12 is utilized to index the assembly positions of all elements of mount 10.

A second embodiment of the present invention is shown in perspective view in FIG. 6. Here, an electronic component, generally referred to as 50, has a plurality of protruding wires 51. The embodiment of FIG. 6 differs from that of FIGS. 1,2,3 and 4 in that a plurality of surface metallizations 52, rather than a single metallization 19, are disposed adjacent end 53 of rigid insulated base 54. The structure of base 54 is otherwise the same as that of the insulated base 12 of FIGS. 1,2,3 and 4. Surface metallizations 52 are electrically isolated from each other, and each is affixed and conductive to a respective one of a plurality of electrical terminal means 55, each having v-shaped notch means 56 defining notch apices 57, with which respective wires 51 coact in the same manner as wire 22 and v-shaped notch means 16 of FIGS. 1,2,3 and 4.

The electronic component 50 is illustrated as having wires which first protrude orthogonal to the mounting face (not shown) of component 50, and then arch toward notch means 57, a structure typical of semiconductor components such as diodes, transistors or monolithic integrated circuits. Although microscopic stresses may have existed when wires 51 were attached to component 50 prior to the assembly shown in FIG. 6, the same principles as illustrated in FIGS. 1,2,3 and 4 reduce or prevent further bending of wires 51. The ability of the present invention to accommodate a wide variety of electronic component types, including types, such as tantalum capacitors, where wire bending stress is critical and others where wire bending stress is less critical, allows the convenient inventory, automated handling and attachment to hybrid substrates or printed circuit boards of any of the mountable component types in intermixture.

FIG. 6 also illustrates contact pins 58 respectively affixed and electrically conductive to each one of a plurality of electrical terminal means 59. The dimensionally precise spatial relationship of contact pins 58 to each other, arising from their fixed spatial relationship to rigid insulative base means 54, permits precise insertion of contact pins 58 into circuit board conductive eyelets (not shown) correspondingly spaced. Although shown as parallel to each other, contact pins 58 may in some applications be splayed or otherwise disposed to suit the particular arrangement of conductive eyelets (not shown) into which they are intended to be inserted.

A third embodiment of the present invention is shown in exploded perspective view in FIG. 7. Structure and deposition of surface metallizations (not shown in FIG. 7) is the same as described heretofore with respect to FIGS. 1–4 and 6, except that rigid insulative base 52 comprises a hollow tube of rectangular cross-section having surface metallization 54 at end 53 for affixation and electrical continuity to electrical terminal 51. Also, surface metallization 59 at end 58 provides for affixation of electrical terminal 55. Terminal 55 has a v-shaped notch 56 defining notch apex 57. Electrical terminals 51 and 55 form end caps or closures to rigid insulative base 52.

When so assembled, the only ingress to the interior of the hollow tube, insulative base 52 is that portion of v-shaped notch 56 remaining open. Suitable plastic settable insulating material (not shown) may be injected through any remaining open portion of v-shaped notch 56 to fill voids between insulative base 52, electronic component 50, and electrical terminals 55,55. Sealing may also be accomplished by closure means (not shown) over any remaining open portion of v-shaped notch 56. FIG. 7 also illustrates an embodiment of first electrical terminal means 51 which is concave to encapsulate a protruding portion of electronic component 50 therein. Thus, a hermetic seal may be achieved.

FIG. 8 shows in perspective view a continuous web 60 comprising a plurality of electrical terminal means 11, 15 in spaced relationship, for facilitating continuous web iterative assembly of the present invention. Web 60 is fabricated from a continuous length of metal. Adjacent electrical terminals 11, 15 are temporarily coupled by web sections 61, which are bowed so as to positively locate rigid insulative base means 12 during assembly, at loci 62.

The method whereby the embodiment of the present invention, shown in FIGS. 1-4, is assembled from its component parts is as follows:

A first surface metallization 14 is applied adjacent a first end 13 to rigid insulative base means 12. A second surface metallization 19 is applied adjacent second end 18 to rigid insulative base means 12. All metallizations may be applied simultaneously, as is well known in the art. First and second electrical terminals 11, 15 are formed, v-shaped notch 16 being formed in second electrical terminal 15, defining a notch apex 17.

First and second electrical terminals 11,15 are temporarily supported in precise spaced relationship to each other by supporting means as exemplified by web 60. Rigid insulative base means 12 is placed with respective surface metallizations 14,19 against terminals 11,15 in precise spatial relationship. Electrical terminal means 11,15 are soldered to respective surface metallizations 14,19.

Electronic component 20 is indexed against first surface metallization 14, wire 22 being simultaneously placed into v-shaped notch 16 adjacent notch apex 17. Electronic component 20 is mechanically affixed and made electrically continuous to first surface metallization 14 at mounting surface 21 by one of soldering, conductive adhesion and the like, and optionally to terminal means 11.

Wire 22 is mechanically affixed within v-shaped notch 16 and made electrically conductive to second electrical terminal means 15 by one of soldering, welding, thermocompression bonding, ultrasonic bonding and the like. Temporary supporting means exemplified by web 60 is disengaged from the dimensionally precise electronic component mount 10. The disengagement from supporting means may be accomplished by cutting and the like. A further step comprises filling voids in dimensionally precise component mount 10 with plastic settable insulating material, and causing the void-filling material to set.

In an embodiment employing non-conductive affixing means, the method of assembly is as follows:

Affixing means 26, 27 such as non-conductive adhesive is applied adjacent end 13 to insulative base 12. Affixing means 19 such as non-conductive adhesive is applied adjacent end 18 to insulative base 12. First and second electrical terminals 11,15 are formed, v-shaped notch 16 being formed in second electrical terminal 15, defining a notch apex 17.

Terminals 11,15 are temporarily supported in precise spaced relationship to each other by supporting means as exemplified by web 60. Insulative base 12 is placed in indexation with terminals 11,15 and affixing means 19,26 and 27 is activated so as to harden or set, or alternatively hardens or sets by drying or chemical reaction with time.

Affixing means 25 is applied to insulative base 12, and either a conductive adhesive or solder 43 is applied to terminal 11. Affixing means 25 may be non-conductive, may be conductive adhesive contiguous with conductive adhesive 43, or may be conductive adhesive abutting solder 43. Electronic component 20 is indexed against affixing means 25,43, wire 22 being simultaneously placed into v-shaped notch 16 adjacent notch apex 17. Affixing means 25 hardens or sets in the same manner as affixing means 19,26,27. If affixing means 43 is a conductive adhesive, it hardens in the same manner as affixing means 19,26,27, and affords electrical continuity between electronic component 20 and terminal 11. If affixing means 43 is solder, heat is applied to solder electronic component 20 to terminal 11. Temporary supporting means exemplified by web 60 is disengaged from mount 10 by cutting and the like. A further step comprises filling voids in mount 10 with plastic settable insulating material, and causing the void-filling material to set.

What has been disclosed is a dimensionally precise electronic component mount, and a method for assembling same. Electrical terminals are affixed with dimensional precision to a rigid insulative base by soldering to surface metallizations or by adhesive means. An electronic component having at least two operative nodes or conductive terminations is affixed in precisely indexed abutment to the rigid insulative base, and made electrically conductive to a first electrical terminal. A protruding wire of the electrical component is conductively affixed within a v-shaped notch at two transverse points or loci-of-tangency adjacent a notch apex in a second electrical terminal. Embodiments have been disclosed wherein the rigid, insulative base is a flat rectangular plate, and alternatively, a hollow tube having rectangular cross-section. Contact surface means and contact pins are disclosed for coaction respectively with hybrid substrates and printed circuit boards. Web means is disclosed for iterative assembly during manufacture. An embodiment is disclosed having a plurality of electrical terminals corresponding to a plurality of wires protruding from the electronic component.

Those skilled in the art will readily derive other embodiments of the invention drawn from the teachings herein. To the extent that such alternative embodiments are so drawn, it is intended that they shall fall within the ambit of protection provided by the claims appended hereto.

Having described our invention in the foregoing specification and the accompanying drawings in such a clear and concise manner that those skilled in the art may readily understand and easily practice the invention, that which we claim is:

1. A dimensionally precise electronic component mount comprising:
   rigid insulative base means having a first surface metallization adjacent a first end and a second surface metallization adjacent a second end opposite said first end, said first surface metallization electrically isolated from said second surface metallization;
   first electrical terminal means solderingly joined orthogonal to said insulative base at said first surface metallization;
   second electrical terminal means solderingly joined orthogonal to said insulative base at said second surface metallization, said second electrical terminal means having v-shaped notch means defining a notch apex in spaced relationship to said insuluative base; and an electronic component having a first operative node electrically conductive to a mounting surface and a second operative node electrically conductive to a wire, said wire extending laterally from said electronic component in a direction parallel said mounting surface, said mounting surface indexingly affixed to said first surface metallization, said mounting surface in electrical continuity to said first surface metallization, said wire affixed within said notch means to said second electrical terminal means adjacent said notch apex, said wire in electrical continuity to said second electrical terminal means adjacent said notch apex, said electronic component physically bounded by said insulative base means, said first electrical terminal means and said second electrical terminal means.

2. A dimensionally precise electronic component mount according to claim 1 wherein said insulative base means comprises a flat rectangular plate having an indexing face and a contact face obverse said indexing face, said first surface metallization upon a first portion of said contact face and an obverse portion of said indexing face, said first surface metallization electrically continuous between said first portion and said obverse portion, said second surface metallization upon a second portion of said contact face, said mounting surface affixed to said first surface metallization at said obverse portion upon said indexing face.

3. A dimensionally precise electronic component mount according to claim 2 wherein said first electrical terminal means and said second electrical terminal means each has contact surface means obverse said surface metallization, for mounting in electrical continuity said dimensionally precise electronic component mount to a substrate.

4. A dimensionally precise electronic component mount according to claim 2 wherein said first electrical terminal means and said second electrical terminal means each have contact pin means in spaced relationship to said insulative base means for mounting in electrical continuity said dimensionally precise electronic component mount to circuit board means having conductive eyelet means in spaced relationship corresponding to said spaced relationship of said contact pin means.

5. A dimensionally precise electronic component mount according to claim 2 wherein said spaced relationship between said notch apex and said insulative base corresponds to the distance between the central axis of said wire and said mounting surface, for elimination of bending moment between said wire and said electronic component in assembly and use.

6. A dimensionally precise electronic component mount according to claim 1 wherein said insulative base means comprises hollow tube means having rectangular cross-section, said first and second ends comprising opposing open ends of said hollow tube means, said first electrical terminal means covering said first end, said second electrical terminal means covering said second end, said first surface metallization defining an indexing face upon at least one flat surface interior to said hollow tube means, said mounting surface affixed to said first surface metallization upon said indexing face.

7. A dimensionally precise electronic component mount according to claim 6 wherein said first electrical terminal means comprises end cap means having recess means, a portion of said electronic component contained within said recess means.

8. A dimensionally precise electronic component mount according to claim 6 wherein said first electrical terminal means and said second electrical terminal means each have contact surface means adjacent an exterior face of said hollow tube means, said exterior face communicating between said first end and said second end, for mounting in electrical continuity said dimensionally precise component mount to a substrate.

9. A dimensionally precise electronic component mount according to claim 6 wherein said first electrical terminal means and said second electrical terminal means each has contact pins in spaced relationship to said insulative base means, for mounting in electrical continuity said dimensionally precise electronic component mount to circuit board means having conductive eyelet means in spaced relationship corresponding to said spaced relationship of said contact pins.

10. A dimensionally precise electronic component mount according to claim 6 wherein said spaced relationship between said notch apex and said insulative base corresponds to the distance between the central axis of said wire and said mounting surface, for elimination of bending moment between said wire and said electronic component in assembly and use.

11. A dimensionally precise electronic component mount comprising:
rigid insulative base means having a first surface metallization adjacent a first end and a plurality of electrically isolated surface metallizations adjacent a second end opposite said first end;
first electrical terminal means solderingly joined orthogonal to said insulative base at said first surface metallization;
a plurlity of second electrical terminal means, each corresponding to one of said plurality of electrically isolated surface metallizations, each said second electrical terminal means solderingly joined orthogonal to said insulative base means at said corresponding one of said plurality of electrically isolated surface metallizations, each said second electrical terminal means having v-shaped notch means defining a notch apex in spaced relationship to said insulative base means; and
an electronic component having a first operative node electrically conductive to a mounting surface and a plurality of second operative nodes, each one of said plurality of second operative nodes electrically conductive to a corresponding one of a plurality of wires, the number of said plurality of second nodes corresponding to the number of said plurality of second electrical terminal means, said wires extending laterally from said electronic component in a direction parallel said mounting surface, said mounting surface in electrical continuity to said first surface metallization, said wires respectively affixed within said notch means in electrical continuity to the respective one of said plurlity of second electrical terminal means adjacent respective said notch apex, said electronic component physically bounded by said insulative base means, said first electrical terminal means and said plurality of second electrical terminal means.

12. A dimensionally precise electronic component mount according to claim 11 wherein said insulative base means comprises a flat rectangular plate having an indexing face and a contact face obverse said indexing face, said first surface metallization upon a first portion of said contact face and an obverse portion of said indexing face, said first surface metallization electrically continuous between said first portion and said obverse portion, said plurality of surface metallizations electrically isolated from each other upon a second portion of said contact face, said mounting surface affixed to said first surface metallization at said obverse portion upon said indexing face.

13. A dimensionally precise electronic component mount according to claim 12 wherein said first electrical terminal means and each one of said plurality of second electrical terminal means have contact surface means obverse said surface metallization, for mounting in electrical continuity said dimensionally precise electronic component mount to a substrate.

14. A dimensionally precise electronic component mount according to claim 12 wherein said first electrical terminal means and each one of said plurality of second electrical terminal means have contact pin means in spaced relationship to said insulative base means, for mounting in electrical contact said dimensionally precise electronic component mount to circuit board means having conductive eyelet means in spaced relationship corresponding to said spaced relationship of said contact pin means.

15. A dimensionally precise electronic component mount according to claim 12 wherein said spaced relationship between said notch apex and said insulative base corresponds to the distance between the central axis of each respective said wire and said mounting surface, for elimination of bending moment between each said wire and said electronic component in assembly and use.

16. A dimensionally precise electronic component mount according to claim 11 wherein said insulative base means comprises hollow tube means having rectangular cross-section, said first and second ends comprising opposing open ends of said hollow tube means, said first electrical terminal means covering said first end, said plurality of second electrical terminal means in combination covering said second end, said first surface metallization defining an indexing face upon at least one flat surface interior to said hollow tube means, said mounting surface affixed to said first surface metallization upon said indexing face.

17. A dimensionally precise electronic component mount according to claim 16 wherein said first electrical terminal means comprises end cap means having recess means, a portion of said electronic component contained within said recess means.

18. A dimensionally precise electronic component mount according to claim 16 wherein said first electrical terminal means and each one of said plurality of second electrical terminal means have contact surface means adjacent an exterior face of said hollow tube means, said exterior face communicating between said first end and said second end, for mounting in electrical continuity said dimensionally precise electronic component mount to a substrate.

19. A dimensionally precise electronic component mount according to claim 16 wherein said first electrical terminal means and each one of said plurality of second electrical terminal means have contact pin means in spaced relationship to said insulative base means, for mounting in electrical continuity said dimensionally precise electronic component mount to circuit board means having conductive eyelet means in spaced relationship corresponding to said spaced relationship of said contact pin means.

20. A dimensionally precise electronic component mount according to claim 16 wherein said spaced relationship between each said respective notch apex and said insulative base corresponds to the distance between the central axis of each respective one of said plurality of wires and said mounting surface, for elimination of bending moment between said wire and said electronic component in assembly and use.

21. A method for assembling a dimensionally precise electronic component mount comprising the steps of:
   applying a first surface metallization adjacent a first end to a rigid insulative base means;
   applying at least one of a plurality of electrically isolated surface metallizations adjacent a second end of said insulated base means;
   forming a first electrical terminal and at least one of a plurality of second electrical terminals;
   forming in each one of said plurality of second electrical terminals a v-shaped notch having a notch apex defined in spaced relationship to said second insulative base;
   temporarily supporting said first electrical terminal and said plurality of second electrical terminals in precise spaced relationship to each other by supporting means;
   emplacing said insulative base in abutment with said temporarily supported electrical terminals at a precise spatial relationship;
   solderingly affixing said temporarily supported electrical terminals at said respective surface metallizations upon said insulated base means;
   emplacing an electronic component having at least one protruding wire and a mounting surface in precisely indexed abutment with said insulative base, said mounting surface being emplaced upon said first surface metallization and each said wire being emplaced within the respective notch apex of said v-shaped notch without flexing said wire;
   affixing so as to establish electrical continuity said mounting surface to said first surface metallization;
   affixing so as to establish electrical continuity each said wire to each respective one of said plurality of second electrical terminals within each respective said notch apex of each respective said v-shaped notch; and
   disengaging said supporting means from said electrical terminals.

22. A method for assembling a dimensionally precise electronic component mount according to claim 21 wherein said step of temporarily supporting said electrical terminals in precise spaced relationship comprises the step of forming web means between said electrical terminals, and the step of disengaging said supporting means from said electrical terminals comprises the step of cutting apart said web means.

23. A method for assembling a dimensionally precise electronic component mount according to claim 22 wherein a plurality of said mounts are assembled upon a continuous web interlinking adjacent said mounts, further comprising the step of disengaging adjacent said mounts by cutting apart said interlinking web.

24. A method for assembling a dimensionally precise electronic component mount according to claim 23 further comprising the step of shaping said interlinking web for spatially precise emplacement of said insulative base in abutment with said interlinking web and said temporarily supported electrical terminals.

25. A method for assembling a dimensionally precise electonic component mount according to claim 21 further comprising the steps of filling with plastic settable insulating material voids bounded by said insulative base and said electrical terminals, and causing said plastic settable insulating material to set, for enhancement of mechanical integrity of said mount.

26. A dimensionally precise electronic component mount comprising:
   rigid insulative base means having a first end and a second end;
   first electrical terminal means rigidly coupled to the first end of said base means;
   second electrical terminal means rigidly coupled to the second end of said base means and having a v-shaped notch means defining a notch apex in spaced relationship to said base means; and
   an electronic component indexingly affixed to said base means and having a first electrical termination conductively coupled to said first electrical terminal means and a second electrical termination, in wire configuration, conductively affixed within said v-shaped notch means adjacent said notch apex at two points transverse said notch means.

27. The component mount of claim 26 wherein said second terminal means has a v-notch defining a broad opening opposite said notch apex, said broad opening accommodating the entry within said v-notch of said wire configured second electrical termination of said component and the entry thereafter of a welding head for mechanically maintaining said wire configured termination unstressed by bending moment forces, within said v-notch approximate said notch apex while said wire configured termination is weldingly affixed at two points transverse said notch means.

28. component mount of claim 27 wherein said first electrical terminal means and second electrical terminal means each has contact surface means for mounting in electrical continuity said component mount to a substrate.

29. The component mount of claim 27 wherein said first electrical terminal means and said second electrical terminal means each have contact pin means in spaced relationship to said insulative base means for mounting in electrical continuity said component mount to circuit board means having conductive eyelet means in spaced relationship corresponding to said spaced relationship of said contact pin means.

30. The component mount of claim 27 wherein said apex of said v-shaped notch is spaced a distance from said insulative base corresponding to the distance between the central axis of said second electrical termination and said insulative base, for elimination of bending moment between said second electrical termination and said electronic component in assembly and use.

31. The component mount of claim 26 wherein said insulative base means comprises hollow tube means having rectangular cross-section, said first and second ends comprising opposing open ends of said hollow tube means, said first electrical terminal means covering said first end, said second electrical terminal means covering said second end.

32. The component mount of claim 31 wherein said first electrical terminal means comprises end cap means having recess means, a portion of said electronic component contained within said recess means.

33. The component mount of claim 31 wherein said first electrical terminal means and said second electrical terminal means each have contact surface means adjacent an exterior face of said hollow tube means, said exterior face communicating between said first end and said second end, for mounting in electrical continuity said dimensionally precise component mount to a substrate.

34. The component mount of claim 31 wherein said first electrical terminal means and said second electrical terminal means each has contact pins in spaced relationship to said insulative base means, for mounting in electrical continuity said component mount to circuit board means having conductive eyelet means in spaced relationship corresponding to said spaced relationship of said contact pins.

35. A method for packaging with dimensional precision an electronic component, said method comprising the steps of:
   (a) providing a dimensionally precise base from which the assembly of all elements of an electronic component mount may be indexed;
   (b) providing an electronic component to be packaged, said component having at least two electrically conductive terminations, at least one of which is wire configured;
   (c) rigidly mounting at least two electrically conductive terminals on said base, at least one of which is provided with a v-shaped notch defining a notch apex;
   (d) coupling said electronic component to said base with each of its electrical terminations in electrical conductive contact with an associated one of each of said base mounted electrically conductive terminals such that each of said wire configured terminations is in conductive contact at two points of said notch adjacent said apex; and
   (e) conductively affixing each said conductively contacting terminations and respective terminals to each other.

36. The method of claim 35 wherein step (e) further comprises the steps of bringing a welding head within each said v-shaped notch; drawing said head into contact with said wire configured terminations in conductive contact with two sides of said notch adjacent said apex; and welding said wire configured terminations at two points of said notch adjacent said apex.

37. The method of claim 36 wherein step (b) further comprises the step of selecting a tantalum capacitor as the component to be packaged.

* * * * *